United States Patent
Peng et al.

[11] Patent Number: 6,117,348
[45] Date of Patent: Sep. 12, 2000

[54] REAL TIME MONITORING OF PLASMA ETCHING PROCESS

[75] Inventors: Yung-Sung Peng, Myan Li; Yuan-Ko Hwang, Hualien; Tsung Tser Lee, Hsin Chuang; Jeng Kuen Lu, I-Lan, all of Taiwan

[73] Assignee: Taiwan Semiconductor Manufacturing Company, Ltd, Hsin Chu, Taiwan

[21] Appl. No.: 09/089,990

[22] Filed: Jun. 3, 1998

[51] Int. Cl.[7] ................................................. G01L 21/30
[52] U.S. Cl. ................................ 216/60; 216/59; 156/345
[58] Field of Search .......................... 156/345; 216/59, 216/60

[56] References Cited

U.S. PATENT DOCUMENTS

| | | | |
|---|---|---|---|
| 4,491,499 | 1/1985 | Jerde et al. | 156/626 |
| 5,097,430 | 3/1992 | Birang | 364/572 |
| 5,343,412 | 8/1994 | Birang | 364/572 |
| 5,626,714 | 5/1997 | Miyazaki et al. | 216/60 |
| 5,711,843 | 1/1998 | Jahns | 156/345 |
| 5,739,051 | 4/1998 | Saito | 438/16 |
| 5,877,032 | 3/1999 | Guinn et al. | 438/9 |
| 5,885,472 | 3/1999 | Miyazaki et al. | 216/60 |
| 5,928,532 | 7/1999 | Koshimizu et al. | 219/121.42 |
| 5,969,805 | 10/1999 | Johnson et al. | 356/72 |
| 5,980,767 | 11/1999 | Koshimizu et al. | 216/60 |

Primary Examiner—Tom Dunn
Attorney, Agent, or Firm—Tung & Associates

[57] ABSTRACT

Real time monitoring of a plasma etching process is performed by monitoring the intensity of a specific wavelength created by the plasma. Changes in the intensity of the plasma wavelength indicate the end-point in time for the process. The end-point value is compared with one or more reference values to determine whether the etching process is stable. End-point values outside of a pre-selected range of values is indicative of unstable processing conditions, thus allowing termination of the etching process before unstable conditions can result in substantial scrap.

2 Claims, 3 Drawing Sheets

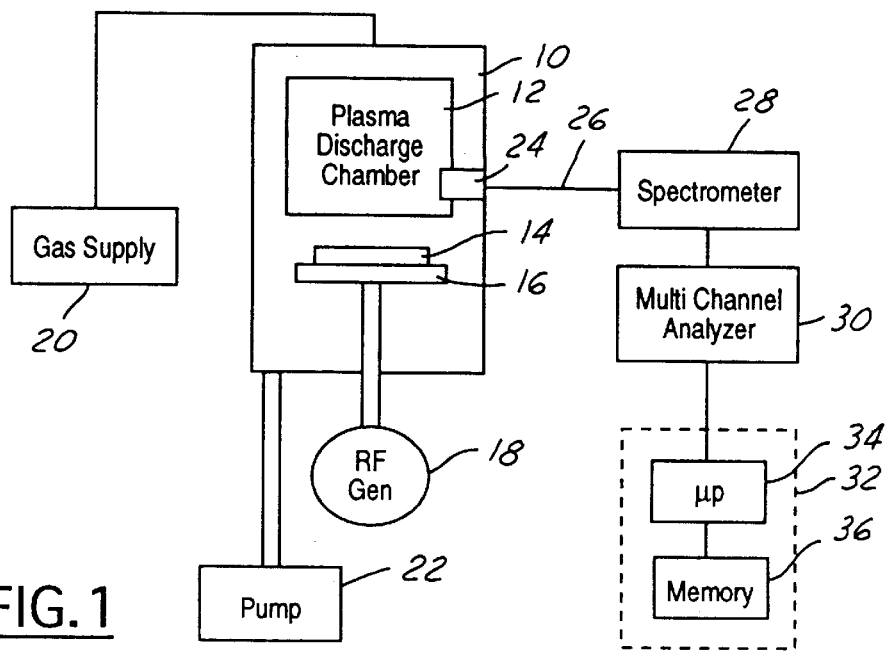

FIG. 1

| EQ, ID | Process Type | Contol Rule Spec. | E/P (sec) | Cause/Action |
|---|---|---|---|---|
| B4420-1 | Poly | Rule 1 5 seconds | 46, 41, 65, ... | Optimize E/P algorithm due to improper delay time |
| B4420-2 | Poly | Rule 1 5 seconds | 47, 53, 48, 44, ... | Replace wafer backside cooling controller due to poor pressure control |
| B4420-7s | Nitride | Rule 1 5 seconds | 29, 21, ... | Replace damaged flat cable of match system due to unstable RF power and Optimize E/P algorithm |
| B4500-5 | Contact | Rule 1 5 seconds | 46, 46, 44, 41, ... | Calibrate upper electrode due to poor parallelism |
| B4420-3s | Nitride | Rule 1 5 seconds | 39, 36, 35, 34, 33, ... | Season chamber after dry clean process due to chamber condition change |
| B4520-5, 7 | Contact | Rule 1 10 seconds | 80, 81, 95, ... | Calibrate E/P detector due to low signal drop rate |
| B4520-1, 10, 16, 19 | Via | Rule 1 10 seconds | 86, 87, 86, 110, ... | Replace upper electrode due to plasma flicker |
| B4520P-A | Passivation | Rule 1 15 seconds | 25, 23, 40, 60, ... | Film thickness issue due to CVD EQ.problem |
| B4720-2, 3 | W-EB | Rule 1 10 seconds | 20, 23, 33, ... | Adjust loadlock inner door due to high $N_2$ leakage from loadlock to chamber, W thickness issue due to CVD problem |

FIG. 4

REAL TIME MONITORING OF PLASMA ETCHING PROCESS

TECHNICAL FIELD

The present invention broadly relates to methods and apparatus for fabricating semi-conductor devices, and deals more particularly with the monitoring of a plasma etching process in order to provide early detection of unstable processing conditions.

BACKGROUND OF THE INVENTION

In the fabrication and processing of semi-conductor devices, such as silicon wafers, a variety of different semi-conductor equipment and/or tools are utilized. These tools and equipment are well-known in the art, and include for example, photolithographic machines, etchers, deposition equipment, furnaces, as well as a variety of sensors and control equipment. Although the capabilities of these types of semi-conductor processing equipment have improved over the years, the technique of monitoring the ongoing process has not necessarily kept pace with the improvements. In the area of monitoring the ongoing semiconductor manufacturing process, current practices generally utilize ex-situ process monitoring. A problem with ex-situ monitoring is that the results are not available until the end of the process, or if in-situ readings are required, the ongoing process must necessarily be uninterrupted in order to obtain the required reading. Moreover, where a number of parameters are monitored for a given process, it is difficult to determine the dependency of one parameter to the others. Such processing parameter correlations are difficult to obtain, and are made even more difficult when measurements are being taken for the purpose of providing in-situ control of the ongoing process.

As mentioned above, one of the processes involved in manufacturing semiconductor devices is etching. A number of etching technologies may be employed, such as reactive ion etching (RIE) for etching fine line patterns in a silicon wafer. RIE involves positioning a masked wafer in a chamber containing plasma. The plasma contains etchant gases which are vertically disassociated in an RF so that the reactive ions contained in the etchant gases are accelerated to the wafer surface. The accelerated reactive ions combine chemically with unmasked material on wafer's surface.

In connection with the plasma etching process, it is known to monitor the progress of the etching process by measuring the intensity of the plasma emissions at a specific wavelength. Changes in the level of intensity of the plasma at the wavelength of interest can be correlated to the progress of the etching process, consequently this technique may be employed to determine the time at which the etching process should be ended, such time point being commonly referred to in the art as the "end-point" time. It is further known that during normal, stable operating conditions, the end-point, as determined by a change in the monitored wavelength, should be within a certain range. However, certain processing conditions, indicative of an unstable processing condition or other problems affect the endpoint time. For example, incorrect process parameters, wrong recipes, improper part installation during maintenance, chamber or line leakage and other similar problems result in an unstable process which is normally not detected until a batch, or even a complete lot of wafers has been processed. This after-the-fact detection of unstable processing conditions results in substantial scrap and decreased yield.

Although it is known that a change in the monitored wavelength of the plasma is correlatable to the end-point time, such information has not been effectively employed for early detection of unstable processing conditions, and particularly with respect to batch-to-batch and lot-to-lot processing variations that reduce yield.

Accordingly, there is a clear need in the art for a method for real time monitoring of a plasma etching process, as well as an apparatus for performing the same, which eliminates each of the deficiencies discussed above.

SUMMARY OF THE INVENTION

According to one aspect of the invention, a method is provided for monitoring a plasma etching process employed to produce multiple batches or lots of semi-conductor devices, such as silicon wafers. The method broadly comprises the steps of detecting a change in a characteristic of the plasma during etching of a wafer or a wafer batch; recording the time when the change in the characteristic is detected, such recorded time representing the duration of the etching and defining an end-point value; comparing the end-point value with one or more reference values corresponding to stable process conditions; and, issuing a notice of unstable process conditions based on the results of the comparison. The characteristic to be detected preferably comprises a change in the intensity of a specific wavelength generated by the plasma employed to perform the etching.

The inventive method also includes the step of storing a plurality of end-point values respectively recorded during the etching of a plurality of corresponding wafers, and employing these stored values as a reference with which a monitored end-point value is compared.

According to another aspect of the invention, apparatus is provided for carrying out the inventive method, comprising means for sensing a particular wavelength of interest emitted by the plasma, means for analyzing the monitored wavelength, and for detecting a change in the intensity of such wavelength, and a program controller for calculating an end-point valve using the measured changes in wavelength intensity and for comparing the measured end-point with one or more reference values corresponding to stable processing conditions.

Accordingly, it is the primary object of the present invention to provide a novel method for monitoring the stability of an etching process used in manufacturing semiconductor devices, which provides early warning of unstable process conditions, thus allowing prompt, corrective measures to be taken.

Another object of the invention is to provide a method as described above which allows monitoring of processes that result in reduced scrap, increase yield and higher throughput.

Another object of the present invention is to provide a method as described above which may be performed using relatively simple components, operating under automatic control.

A further object of the present invention is to provide a novel method as described above which allows controlling the quality of etching not only on a single wafer or wafer batch basis, but on a lot-to-lot basis as well.

Another object of the present invention is to provide an apparatus for carrying out the inventive method discussed above using commonly available components.

These, and further objects and advantages of the present invention, will be made clear or will become apparent during the course of the following description of a preferred embodiment chosen to illustrate the invention.

BRIEF DESCRIPTION OF THE DRAWINGS

In the drawings, which form an integral part of the specification and the appended claims, and which are to be read in conjunction therewith, and wherein like reference numerals are employed to designate identical components of the various views:

FIG. 1 is a combined block and diagrammatic view of a plasma etching system employing the real time monitoring apparatus which forms the preferred embodiment of the present invention;

FIG. 4 is a table showing process test results according to the method of the present invention, and correlating end-point times to various process conditions and problems.

DETAILED DESCRIPTION OF THE PREFERRED EMBODIMENTS

Figure 2:
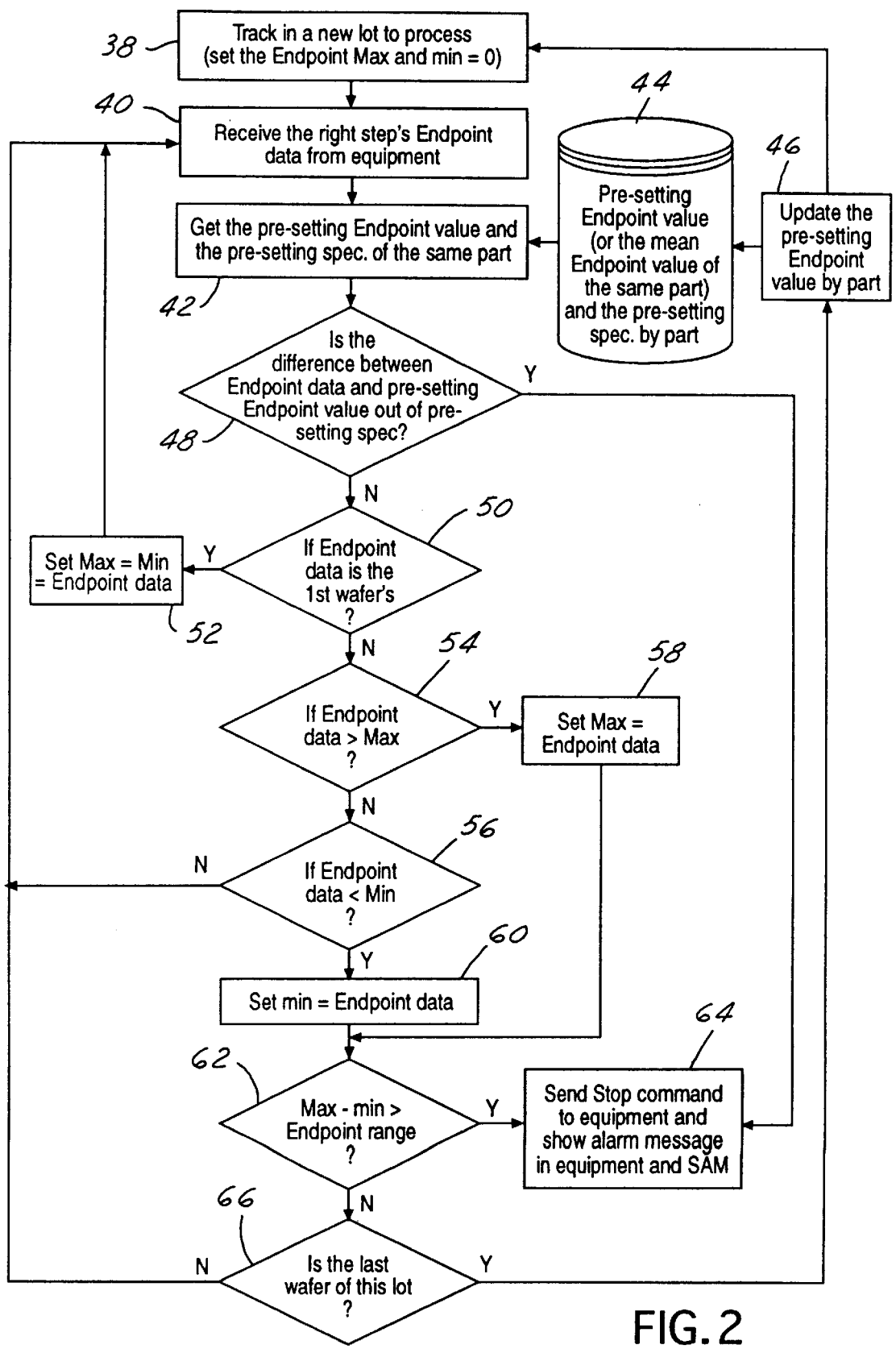
FIG. 2 is a logical flow chart of the steps and related software instructions for the real time monitoring method which forms a preferred embodiment of the present invention.

Reference is first made to FIG. 1 which depicts the primary components of a typical reaction ion etching system, as well as certain components forming the real time monitoring system of the present invention. A wafer 14 to be etched, typically a masked wafer, is placed on a cathode 16 inside a plasma chamber 12 filled with plasma, all of which components form a part of a plasma etching apparatus 10. Although the reactive ion etching system shown in FIG. 1 employs a cathode 16 as the heating source, a system in which both the anode and cathode are powered can also be utilized. Further, it should be understood that the present invention is applicable to other types of plasma etching systems as well.

A gas supply 20 provides the necessary etchant gas to the plasma in the chamber 12, and a pump 22 is employed for evacuating plasma discharge during etching. An RF generator 18 supplies RF power to the cathode 16 so as to form an RF field in the plasma. The RF field causes reactive ions contained in the etchant gas to accelerate to the surface of the wafer 14. The thus accelerated reactive ions combine chemically with unmasked material on the surface of the wafer so as to form volatile etch product. The volatile etch product is released into the plasma and a plasma chamber 12 and a plasma discharges is formed. This discharge includes the emissions of light at specific wavelengths which are determined by the particular gases and materials employed in the process. For example, a CO plasma employed to etch an oxide surface emits light at a wavelength of 480–485 nm, an Al plasma used to etch metal substrates emits light at a wavelength of 396 nm, and a SF plasma used to etch a polysilicon substrate emits light at a wavelength of approximately 400 nm.

Changes in the level of intensity of the wavelength emitted by the plasma in the chamber 12 are continuously monitored by a suitable sensor 24 which transmits the monitored wavelength via a line, which may comprise an optical fiber 26, to a device such as a spectrometer 28, which in turn outputs a signal to the device such as a multi-channel analyzer 30 which isolates the wavelength of interest and measures its intensity. The measured intensity, as well as changes therein, is transmitted by the analyzer 30 to a programmed controller 32 which includes a microprocessor controller 34 provided with suitable memory 36 for storing end-point time reference values, as will be discussed later in more detail. The microprocessor 34 operates in accordance with a set of programmed instructions (described later in more detail) which receives data from the analyzer 30 relating to changes in the monitored wavelength, determines the end-point time for a wafer or batch of wafers being processed, and compares the determines the end-point time with one of more reference values. Based on the results of the comparison thus performed, the controller 32 may issue a notice announcing that the etching process has become unstable and/or issue instructions which result in either alteration or termination of the etching process within the etching apparatus 10.

During a stable etching process, the end-point (in time) of the process for a given wafer (or wafer batch) should be within a certain range. Any significant change of the end-point is normally the result of variables which affect the quality of the etching process. As previously indicated, heretofore, there has been no effective method to monitor the deviation of the end-points between the processing of a batch of wafers or between lots of wafers. The method of the present invention contemplates monitoring the process by comparing the end-point of wafer being processed each with the end-points for other batches or lots, or with a preselected set point. If the end-point deviation is larger than a certain value, then, as mentioned above, a notification or warning is issued by the controller 32, or alternatively the controller 32 interrupts the etching process.

As previously mentioned, it is known that the end-point generally must be within a certain range for a stable etching process. For example, in connection with one known etching system, it is known that the etching process is stable if the end-point is within approximately 50±5 seconds. Relatively small deviations from the ideal range of end-points is not easily detected either by normal processing equipment, or the equipment operator. According to the method of the present invention however, the stability of the etching process may be determined by comparing the end-point difference with one or more reference values. According to one embodiment, the invention provides a method for monitoring the end-point difference by a wafer to wafer comparison (within the same lot of wafers) according to:

$$E_k = I_n - I_k, \; n=1,2,3 \ldots, \; k=1,2 \ldots, n$$

where $E_k$ are the $1, 2, \ldots, n_{th}$ E/P differences $I_n$ is the monitored E/P of the $n_{th}$ processing wafer $I_k$ are the E/Ps of the $1, 2, \ldots, n_{th}$ processing wafers It has been found during tests that this embodiment of the method of the present invention allows end-point to be determined within ±3 seconds. According to this embodiment, the end-point of a wafer batch being processed is compared to each former batch within the lot. For example, the end-point of the fifth batch is compared to the end-points of the 1, 2, 3, 4th wafers. In the event that a measured end-point deviates outside of the ranges determined by the end-points of the previous wafers, an alarm is issued or the equipment is halted.

Alternatively, according to another embodiment of the method of the present invention, the end-point difference may be monitored for a given wafer or batch, with reference to a pre-selected set point according to:

$$E_n = I_n - C, \; n=1,2,\ldots$$

where $E_n$ is the $n_{th}$ E/P differences $I_n$ is the monitored E/P of the $n_{th}$ processing wafer C is the set point of E/P According this second embodiment of the method, the end-point of each wafer batch is compared to a pre-selected reference or set point which, for example, may comprise the average of a plurality of known, normal end-point values. Again, in the event that the end-point difference is outside a specified range, an alarm is issued or the equipment is halted.

Referring now to FIG. 2, initially, as indicated at 38, upon commencement of the processing of a new lot of wafers, the end-point maximum and minimum values are set to 0, following which, at 40 the right step's end-point data is received from the processing equipment. Then, at step 42, the pre-setting end-point valve and the pre-setting spec for the same batch are obtained. At step 48, a determination is made as to whether the difference between the end-point data and the pre-set end-point value are within or outside of the predetermined or pre-set specified value. If the difference is outside of the pre-set spec, a stop command is issued at 64 and an alarm message is displayed. However, if the difference determined at step 48 is within the pre-set spec, a determination is made at 50 as to whether the end-point data is that of the first wafer or batch thereof. If the end-point data is that of the first batch, the end-point data for the maximum is set equal to the minimum value, at step 48. If, however, the end-point data is not that of the first batch, then a determination is made at step 54 as to whether the end-point data exceeds a maximum value. If the maximum value is exceeded, then the pre-set maximum value is set equal to the end-point data at step 58. However, at step 54, if the end-point data is not greater than the established maximum value, then a determination is made in step 56 as to whether the end-point data is less than the preset minimum value. If the end-point data is less than the minimum value, then the minimum value is set equal to the end-point data at step 60, and a determination is then made at step 62 of whether the difference between the maximum and minimum values is greater than a preselected range of end-point values. If the answer is yes to the calculation made at step 62, then a stop command is issued at step 64. Otherwise, the routine continues and a determination is made at step 66 as to whether the comparison just made were that for the last wafer (or batch) of a given lot. If the answer at step 66 is no, the process is continued at step 40. If, however, the end-point comparison is that of the last batch for the lot, then at step 46, the pre-set end-point value is updated, and at step 44, the end-point value which has been pre-set, or the average or mean end-point value for the same part is pre-set as the new value which is then available to be used at step 42.

Figure 3:
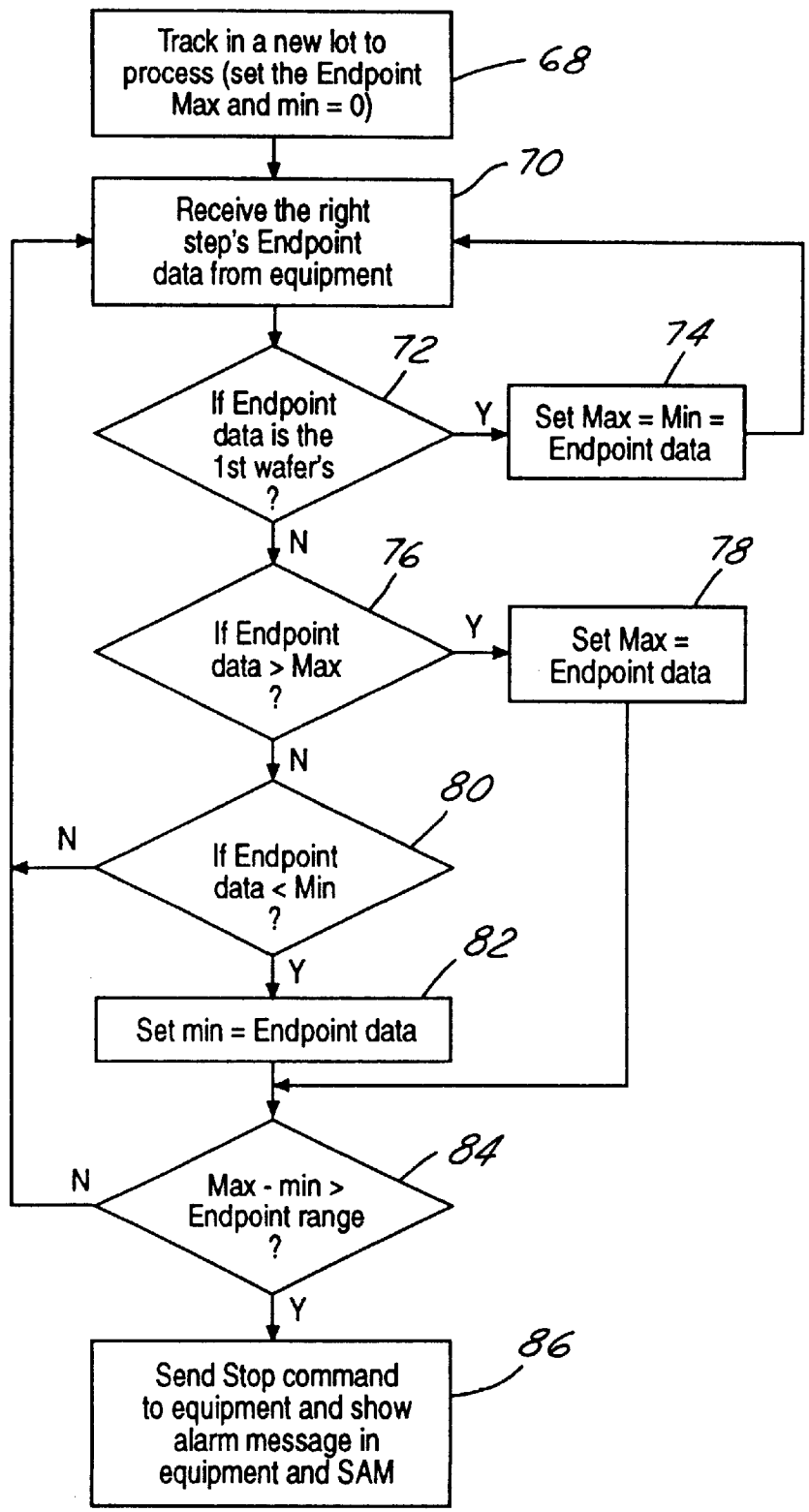
FIG. 3 is a view similar to FIG. 2 but depicting an alternate form of the present invention.

Although the methodology shown in FIG. 2 represents the preferred form of the present invention, an alternate methodology is depicted in FIG. 3. To commence the process shown in FIG. 3, the end-point maximum and minimums are set to 0, at step 68, for a new lot of wafers to be processed. Then, in step 70, end-point data from the etching equipment is received and a determination is then made at step 62 of whether the end-point data being compared is that of the first wafer or batch thereof. If the end-point data is that of the first batch, then, in step 74, the pre-set minimum and maximum values are set equal to the end-point data which are then used at step 70. However, if the end-point data is not that of the first batch, then a determination is made as to whether the end-point data is greater than a maximum value, at step 76. If the answer to the decision at step 76 is yes, then the maximum value is set equal to the end-point data at step 78. On the other hand, if the answer to the decision made at step 76 is no, a determination is then made at step 80 as to whether the end-point data is less than the minimum pre-set value, then a new set of end-point data is received from the processing equipment at step 70; however, if the end-point data is determined, at step 80 to be less than the minimum pre-set value, then the set point value for the minimum value is set equal to the end-point data at step 82 following which, at step 84, a determination is made as to whether the difference between the minimum and maximum set points has exceeded a pre-selected range of end-point values. If the answer to the decision made at step 84 is yes, then a stop command is issued and/or an alarm message is issued at step 86. Otherwise, the next set of end-point data is received from the processing equipment at step 70.

The foregoing method and apparatus for practicing the same has been used to process a variety of wafers under actual test conditions, using different items of equipment. The results of these actual tests are depicted in the table shown in FIG. 4. Referring now to FIG. 4, column 88 identifies the particular piece of equipment being employed, while column 89 identifies type of substrate being etched. Column 92 lists the pre-selected range of end-point values used as a reference for the monitoring process, and column 94 depicts the various end-points actually measured. Finally, column 96 identifies the causes in those instances where real time monitoring of the end-point values falling outside the pre-set range of acceptance values indicated a problem with the process, or otherwise unstable processing conditions.

From the foregoing, it is apparent that the method and apparatus of the present invention not only provide for the reliable accomplishment of the objects of the invention, but do so in an particularly economical and effective manner. It is recognized, of course, that those skilled in the art may make various modifications or additions to the preferred embodiment chosen to illustrate the invention without departing from the spirit and scope of the present contribution of the art. Accordingly, it is to be understood that the protection sought and to be afforded hereby should be deemed to extend to the subject matter claimed and all equivalents thereof fairly within the scope of the invention.

What is claimed is:

1. A method of controlling a plasma etching process used to process each of a plurality of semiconductor wafers forming a batch thereof, comprising the steps of:

a) measuring the intensity of a particular wavelength of light emitted by the plasma used to perform said etching, said particular wavelength varying in intensity in accordance with the rate of etching of each of said wafers;

b) recording the time when a change occurs in the intensity measured in step (a) indicating an endpoint in the etching of the wafer;

c) storing the time recorded in step (b) for each of the wafers in said batch, the stored times forming a stored range of endpoint time values associated with stable process conditions;

d) comparing the time measured in step (a) with the range of time values stored in step (c); and e) issuing a notice of an unstable process condition when one of the times compared in step (a) is outside the range of time values stored in step (c).

2. A method of controlling a plasma etching process used to process each of a plurality of semiconductor wafers forming a batch thereof, comprising the steps of:

a) measuring the intensity of a particular wavelength of light emitted by the plasma used to perform said etching, said particular wavelength varying in intensity in accordance with the rate of etching of each of said wafers;

b) recording the time when a change occurs in the intensity measured in step (a) indicating an endpoint in the etching of the wafer;

c) storing the time recorded in step (b) for each of the wafers in said batch, each of the stored times being associated with stable process conditions;

d) determining the average value of the times stored in step (c);

e) comparing the time measured in step (a) with the average value determined in step (c); and f) issuing a notice of an unstable process condition when the comparison performed in step (e) results in a variance beyond a preselected value.

* * * * *